(12) United States Patent
Tang

(10) Patent No.: US 6,703,709 B1
(45) Date of Patent: *Mar. 9, 2004

(54) STRUCTURES FORMED USING SILICIDE CAP AS AN ETCH STOP IN MULTILAYER METAL PROCESSES

(75) Inventor: Sanh D. Tang, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/290,531

(22) Filed: Apr. 12, 1999

Related U.S. Application Data

(62) Division of application No. 09/146,744, filed on Sep. 3, 1998, now Pat. No. 6,117,793.

(51) Int. Cl.⁷ .................................................. H01L 23/48
(52) U.S. Cl. ...................... 257/754; 257/751; 257/752; 257/915
(58) Field of Search ................................ 257/751, 752, 257/915, 754, 750, 753, 755, 756–771

(56) References Cited

U.S. PATENT DOCUMENTS

| | | | |
|---|---|---|---|
| 4,680,086 A | | 7/1987 | Thomas et al. |
| 4,796,081 A | * | 1/1989 | Cheung et al. ............... 357/71 |
| 4,998,157 A | * | 3/1991 | Yokoyama et al. ........... 357/65 |
| 5,269,879 A | | 12/1993 | Rhoades et al. |
| 5,420,076 A | | 5/1995 | Lee et al. |
| 5,514,247 A | | 5/1996 | Shan et al. |
| 5,519,254 A | * | 5/1996 | Tabara ........................ 257/751 |
| 5,600,182 A | * | 2/1997 | Schinella et al. ........... 257/763 |
| 5,612,254 A | | 3/1997 | Mu et al. |
| 5,668,411 A | * | 9/1997 | Hong et al. .................. 257/751 |
| 5,717,253 A | * | 2/1998 | Shin et al. ................... 257/754 |
| 5,747,879 A | * | 5/1998 | Rastogi et al. .............. 257/751 |
| 5,793,111 A | * | 8/1998 | Zamanian ..................... 257/751 |
| 5,801,427 A | * | 9/1998 | Shiratake et al. ........... 257/412 |
| 5,872,061 A | | 2/1999 | Lee et al. |
| 5,888,309 A | | 3/1999 | Yu |
| 5,892,282 A | * | 4/1999 | Hong et al. .................. 257/751 |
| 5,904,154 A | | 5/1999 | Chien et al. |
| 5,920,122 A | * | 7/1999 | Matsumoto et al. ........ 257/764 |
| 5,923,052 A | * | 7/1999 | Kim ............................ 257/91 |
| 5,942,799 A | * | 8/1999 | Danek et al. ................ 257/751 |
| 5,945,739 A | * | 8/1999 | Yajima ....................... 257/758 |
| 5,955,785 A | * | 9/1999 | Gardner et al. ............. 257/751 |
| 5,958,801 A | | 9/1999 | Langley |
| 5,998,871 A | * | 12/1999 | Urabe ......................... 257/754 |
| 6,028,359 A | * | 2/2000 | Merchant et al. ........... 257/750 |
| 6,127,249 A | * | 10/2000 | Hu .............................. 438/583 |
| 6,144,097 A | * | 11/2000 | Asahina et al. ............. 257/751 |
| 6,175,155 B1 | * | 1/2001 | Hill ............................ 257/754 |

OTHER PUBLICATIONS

US 6,239,493, 5/2001, Yoo et al. (withdrawn)*

* cited by examiner

Primary Examiner—Eddie Lee
Assistant Examiner—Edgardo Ortiz
(74) Attorney, Agent, or Firm—TraskBritt

(57) ABSTRACT

A layered trace configuration comprising a conductive trace capped with a silicide material which allows for removal of oxide polymer residues forming in vias used for interlayer contacts in a multilayer semiconductor device and eliminates or greatly reduces the formation of metal polymer residues in the vias. The formation of an interlayer contact according to one embodiment of the present invention comprises providing a trace formed on a semiconductor substrate and a silicide layer capping the conductive layer. An interlayer dielectric is deposited over the silicide capped trace and the substrate. A via is etched through the interlayer dielectric, wherein the etch is selectively stopped on the silicide layer. Any residue forming in the via is removed and a conductive material is deposited in the via to form the interlayer contact.

19 Claims, 7 Drawing Sheets

STRUCTURES FORMED USING SILICIDE CAP AS AN ETCH STOP IN MULTILAYER METAL PROCESSES

This application is a division of application Ser. No. 09/146,744 filed Sep. 3, 1998 now U.S. Pat. No. 6,117,793.

BACKGROUND OF THE INVENTION

1. Field of the Invention

The present invention relates to a layered trace configuration which prevents the formation of metal polymer residues and allows for removal of oxide polymer residues from a via with substantially no damage to the via or underlying structures carried on a semiconductor substrate.

2. State of the Art

Higher performance, lower cost, increased miniaturization of components, and greater packaging density of integrated circuits are ongoing goals of the computer industry. One commonly used technique in the fabrication of integrated circuits involves stacking of multiple layers of active and passive components one atop another to allow for multilevel electrical interconnection between devices formed on each of these layers. This multilevel electrical interconnection is generally achieved with a plurality of metal-filled visa ("contacts") extending through dielectric layers which separate the component layers from one another. These visa are generally formed by etching through each dielectric layer by etching methods known in the industry, such as plasma etching and reactive ion etching. A fluorinated gas, such as $CF_4$, $CHF_3$, $C_2F_6$, $CH_2F_2$, $SF_6$, or other freons, and mixtures thereof, in combination with a carrier gas, such as Ar, He, Ne, Kr, $O_2$, or mixtures thereof, are usually used as the etching gas for these etching methods. A problem with such etching methods is that at least one layer of residue forms in the visa as a result of the etching process.

An exemplary method for forming a via through a dielectric layer is illustrated in FIGS. 10–13. It should be understood that the figures presented in conjunction with this description are not meant to be actual cross-sectional views of any particular portion of an actual semiconductor device, but are merely idealized representations which are employed to more clearly and fully depict the process of this typical method than would otherwise be possible.

FIG. 10 illustrates an intermediate structure comprising a semiconductor substrate 200 bearing a dielectric or insulating layer 202 (such as an oxide-silicon dioxide, etc.) having a metal-containing trace or pad 204 of aluminum, copper, aluminum/copper alloys, or the like, formed thereon. The term "semiconductor substrate" is used herein to denote any solid semiconductor surface, such as is provided by a silicon or gallium arsenide wafer, or a layer of such material formed on glass, ceramic, sapphire, or other supporting carrier, as known in the art, and includes such semiconductor surfaces bearing an insulating layer thereon. The term "trace" is used herein to denote any metallized structure in a semiconductor device including, but not limited to, conductive traces and conductive pads.

A barrier layer 206 (such as titanium nitride) is deposited over the metal-containing trace or pad 204 and an interlayer dielectric 208 (such as silicon dioxide) is disposed over the barrier layer 206. As shown in FIG. 11, the interlayer dielectric 208 is masked with a resist material 212, which is then patterned to define a via location. A partial via 214 is then selectively etched with a fluorinated gas down to the barrier layer 206, which acts as an etch stop. The etching of the partial via 214 results in a first residue layer 216 of a carbon-fluorine based polymer containing residue of the interlayer dielectric 208 ("oxide polymer") coating the sidewall 218 of the partial via 214, as shown in FIG. 12.

The barrier layer 206 at the bottom of partial via 214 is then etched to expose the metal-containing trace or pad 204 and form a full via 222, as shown in FIG. 13. However, due to the variation in the thickness of the interlayer dielectric 208 from the center of a wafer to the edge (usually between 4000 and 5000 Å), an over-etch is applied, such that the via will usually extend through the barrier layer 206 and into the metal-containing trace or pad 204. When the barrier layer 206 and metal containing trace or pad 204 are etched, a second residue layer 224 ("metal polymer") of a carbon-fluorine based polymer including metal etched from the metal-containing trace or pad 204, as well as any metal components in the barrier layer 206, such as the titanium in a titanium nitride barrier layer, is formed over the first residue layer 216 and the exposed surface 226 of the metal-containing trace or pad 204, also shown in FIG. 13.

It is, of course, understood that a single etch could be performed to expose the metal-containing trace or pad 204, which etch would result in a single residue layer. However, even if a single etch were performed, the single residue layer would still have a portion of the residue layer adjacent the via sidewall 218 containing predominantly oxide polymer and a portion adjacent the via aperture and the bottom of the via containing predominantly metal polymer.

Residue layers, such as first residue layer 216 and second residue layer 224, which coat the full via, are very difficult to remove. These residue layers may be removed by dipping the structure in a phosphoric acid solution; and, although this technique is effective in removing most of the residue layers, the residue layers are still not completely removed. The portion of the residue still remaining after the phosphoric acid dip adversely affects the conductivity of contacts subsequently formed in the full via 222. It is noted, that although extending the residence time of the semiconductor substrate structure in the phosphoric acid will effectively remove all of the residue layer(s), the increased residence time also results in damage to the metal-containing trace or pad 204.

Thus, it can be appreciated that it would be advantageous to develop a technique to form a via which prevents the formation of metal polymer residues and allows for removal of oxide polymer residues from the via without substantial damage to the metal-containing trace or pad while using commercially-available, widely-practiced semiconductor device fabrication techniques.

SUMMARY OF THE INVENTION

The present invention relates to a layered trace comprising a conductive trace capped with a silicide material. When such a layered trace is used in a multilayer semiconductor structure, it allows for non-damaging removal of any oxide polymer residues forming in visa used to electrically connect the various layers through dielectric layers separating them, and eliminates or greatly reduces the formation of metal polymer residues in the visa. This results in better contact reliability.

One embodiment of forming an interlayer contact according to the present invention involves providing a conductive layer deposited over a semiconductor substrate. A substrate dielectric or insulating layer preferably separates the semiconductor substrate from the conductive layer. A silicide layer, such as tungsten silicide, cobalt silicide and the like, is disposed over the conductive layer. An optional barrier layer, such as a thin film of titanium, may be disposed between the conductive layer and the silicide layer to prevent silicon molecules from the silicide layer from migrating into and contaminating the metals in the conductive layer.

A first resist material is patterned over the silicide layer and the silicide layer, the barrier layer, and the conductive layer are etched and any remaining first resist material is removed to form a layered trace or pad. An interlayer dielectric is deposited over the layered trace and the substrate dielectric. A second resist material is then patterned over the interlayer dielectric layer such that an opening in the second resist material is positioned over the layered trace.

The interlayer dielectric layer is then etched, preferably using an oxide etch selectively stopping on the silicide layer, through the opening in the second resist material to form a via through the interlayer dielectric layer to the silicide layer of the layered trace. The etching of the via through the interlayer dielectric layer creates an oxide polymer residue layer on sidewalls of the via. As used herein, the term "sidewall" of a via encompasses both a single, continuous sidewall such as may define a round or circular via, as well as a plurality of sidewalls defining a via of other cross-section. The presence of the oxide polymer residue layer is a natural consequence of the etching of the via and, since the etching gas generally comprises a fluorinated gas, the oxide polymer residue layer is usually a carbon-fluorine based polymer containing residue of the interlayer dielectric.

The oxide polymer residue layer and any remaining second resist material are preferably removed by any suitable known technique. At this point, an upper-layer trace or contact can be formed over the interlayer dielectric and into the via to make electrical contact with the silicide layer of the layered trace. However, if electrical resistance is a concern, a highly selective etch can be used to subsequently remove the silicide layer in the via, which will reduce contact resistance by bringing subsequently deposited conductive material into direct contact with the barrier layer or the conductive layer. An upper-layer trace or a contact may be completed by depositing a conductive material into the via.

It is, of course, understood that the layered trace may be formed on an interlayer dielectric above the semiconductor substrate with another interlayer disposed over the layered trace and the interlayer dielectric, with a contact being formed to the layered trace in a manner described above.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

FIGS. 1–9 illustrate one embodiment for layered trace and contact via formation according to the present invention. It should be understood that the figures presented in conjunction with this description are not meant to be actual cross-sectional views of any particular portion of an actual semiconductor device, but are merely idealized representations which are employed to more clearly and fully depict the process of the invention than would otherwise be possible.

Figure 1:
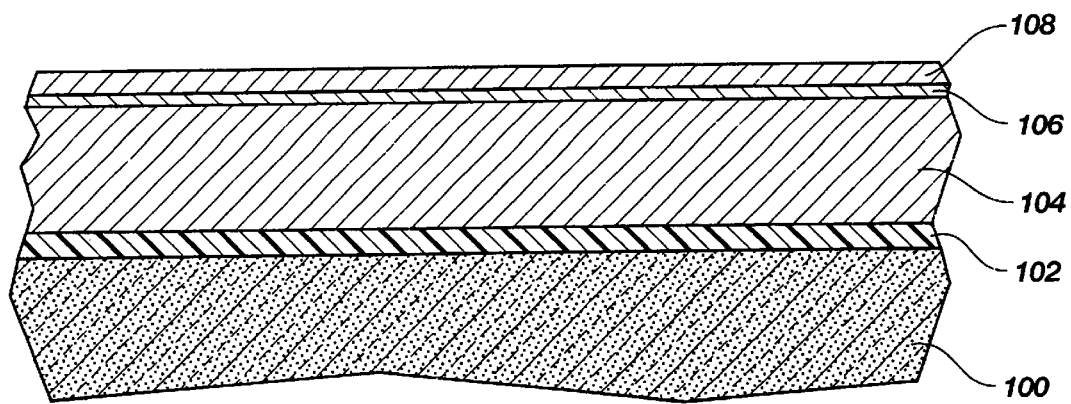
FIGS. 1–9 are side cross-sectional views of a method of forming an electrical trace according to a technique of the present invention.

FIG. 1 illustrates a conductive layer 104, preferably an aluminum/copper alloy, deposited over a substrate dielectric or insulating layer 102, such as silicon dioxide, atop a semiconductor substrate 100. A silicide layer 108, preferably tungsten silicide between about 400 and 600 Å thick, is disposed over the conductive layer 104. An optional barrier layer 106, preferably titanium or titanium nitride about 100 Å thick, is disposed between the conductive layer 104 and the silicide layer 108. The optional barrier layer 106 is used to prevent silicon molecules from the silicide layer 108 from migrating into and contaminating the metals in the conductive layer 104, if the metals are susceptible to such contamination.

Figure 2:
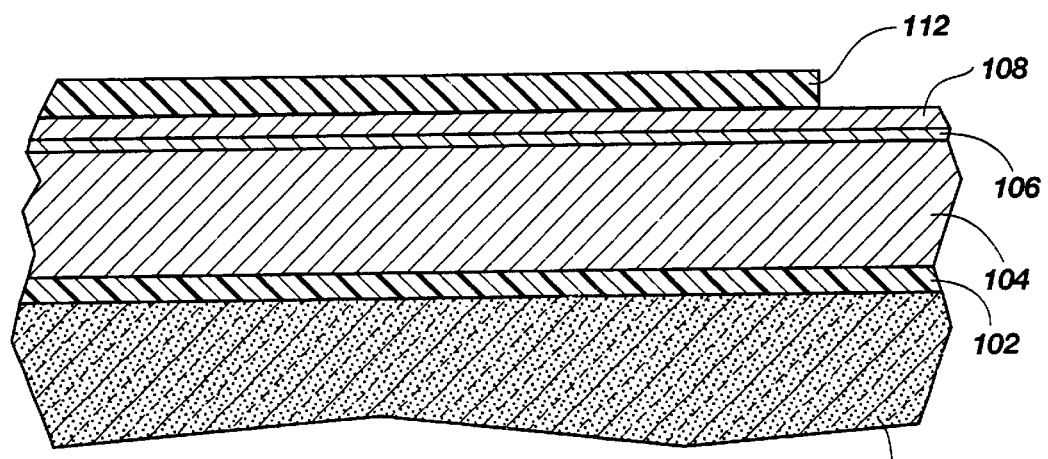
Figure 3:
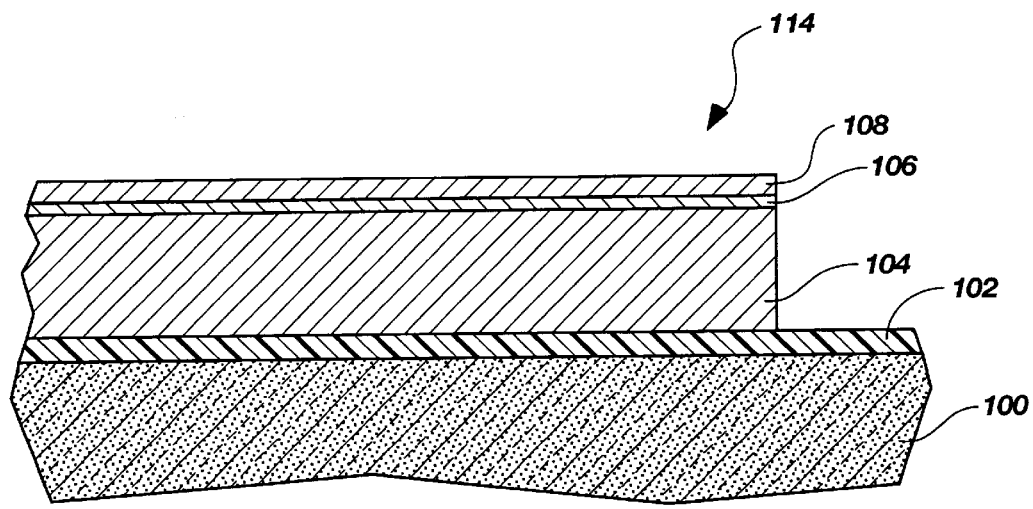
Figure 4:
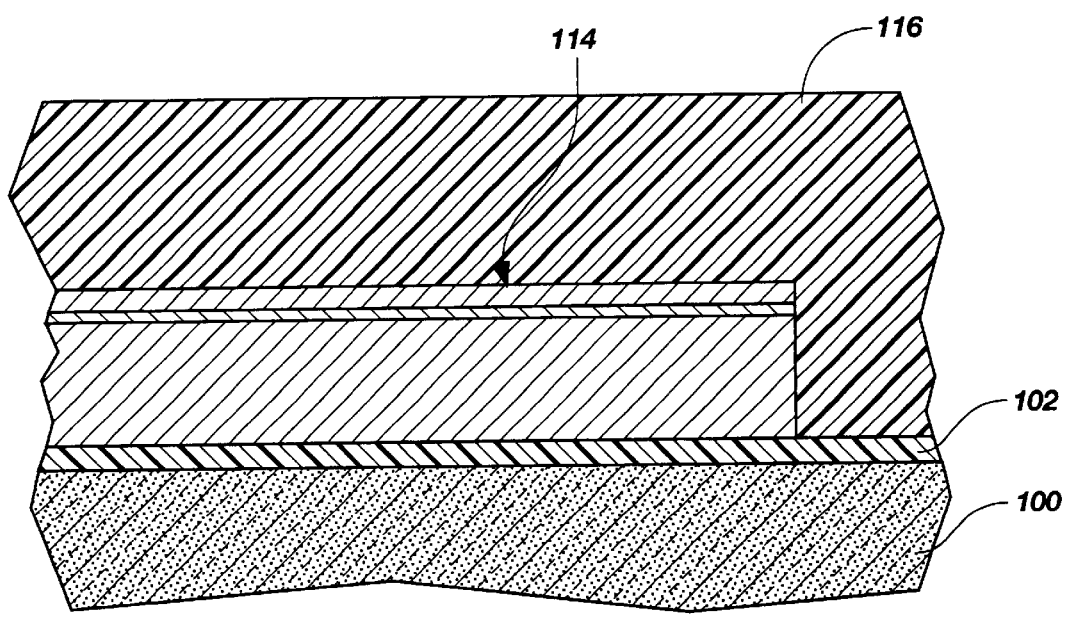
Figure 5:
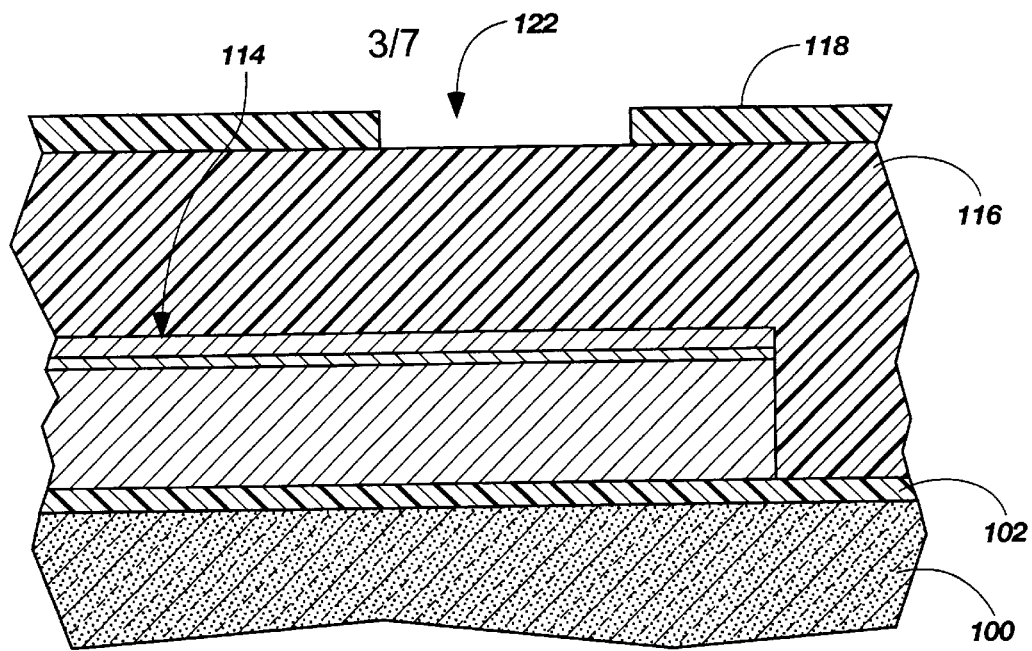

A first resist material 112 is patterned over the silicide layer 108, as shown in FIG. 2. The silicide layer 108, the barrier layer 106, and the conductive layer 104 are etched and any remaining first resist material 112 is removed to form a layered trace or pad 114, as shown in FIG. 3. An interlayer dielectric 116, such as silicon dioxide, spin-on-glass, or the like, is deposited over the layered trace 114 and the substrate dielectric 102, as shown in FIG. 4. The interlayer dielectric layer 116 is preferably planarized such as by chemical mechanical planarization. A second resist material 118 is then patterned over the interlayer dielectric layer 116 such that an opening 122 in the second resist material 118 is positioned over the layered trace 114, as shown in FIG. 5.

Figure 6:
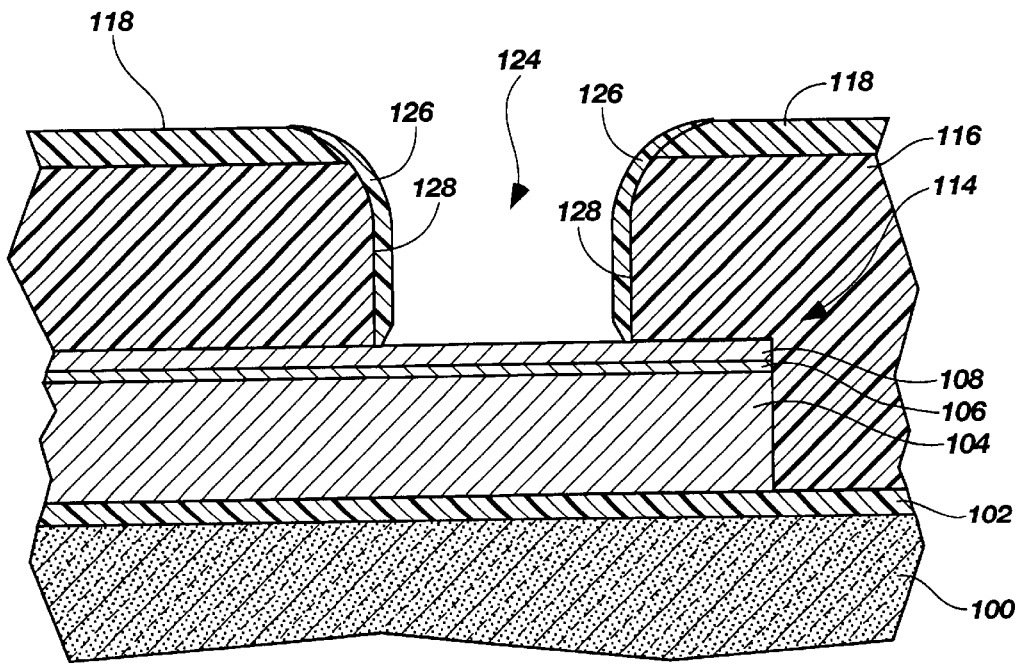

As shown in FIG. 6, the interlayer dielectric layer 116 is then etched, preferably using an oxide etch selectively stopping on the silicide layer 108, such as plasma etching and reactive ion etching with a fluorinated gas ($CF_4$, $CHF_3$, $C_2F_6$, $CH_2F_2$, or other freons, and mixtures thereof) in combination with a carrier gas, such as Ar, He, Ne, Kr, $O_2$, or mixtures thereof, through the opening 122 in the second resist material 118 to form a via 124 through the interlayer dielectric layer 116 to the silicide layer 108 of the layered trace 114. The etching of the via 124 through the interlayer dielectric layer 116 creates an oxide polymer residue layer 126 on sidewalls 128 of the via 124. As used herein, the term "sidewall" of a via encompasses both a single, continuous sidewall such as may define a round or circular via, as well as a plurality of sidewalls defining a via of other cross-section. The presence of the oxide polymer residue layer 126 is a natural consequence of the etching of the via 124 and, since the etching gas generally comprises a fluorinated gas, the oxide polymer residue layer 126 is usually a carbon-fluorine based polymer containing residue of the interlayer dielectric layer 116.

Figure 7:
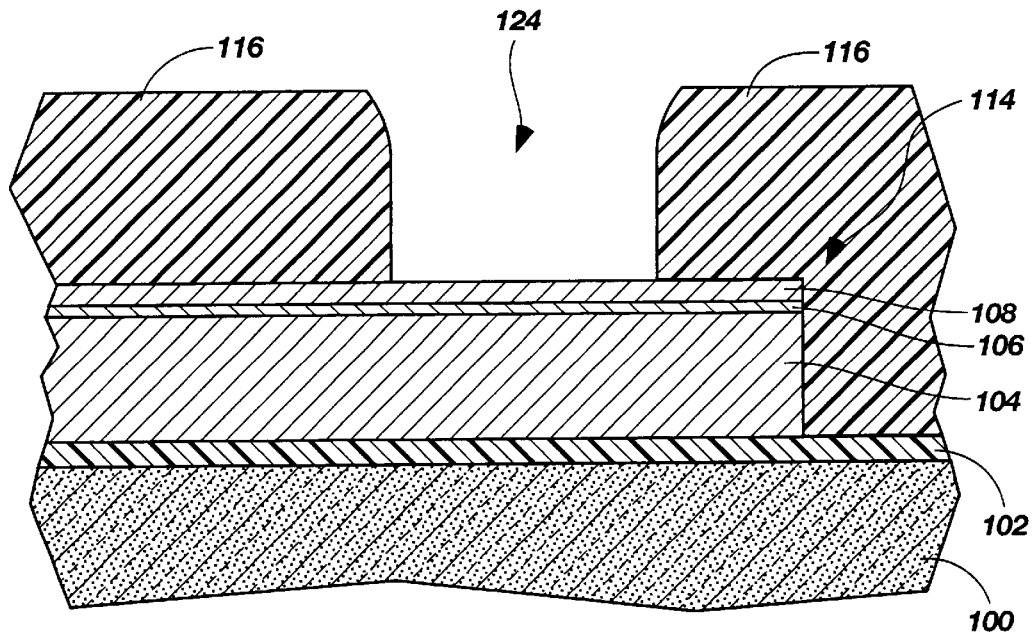
Figure 8:
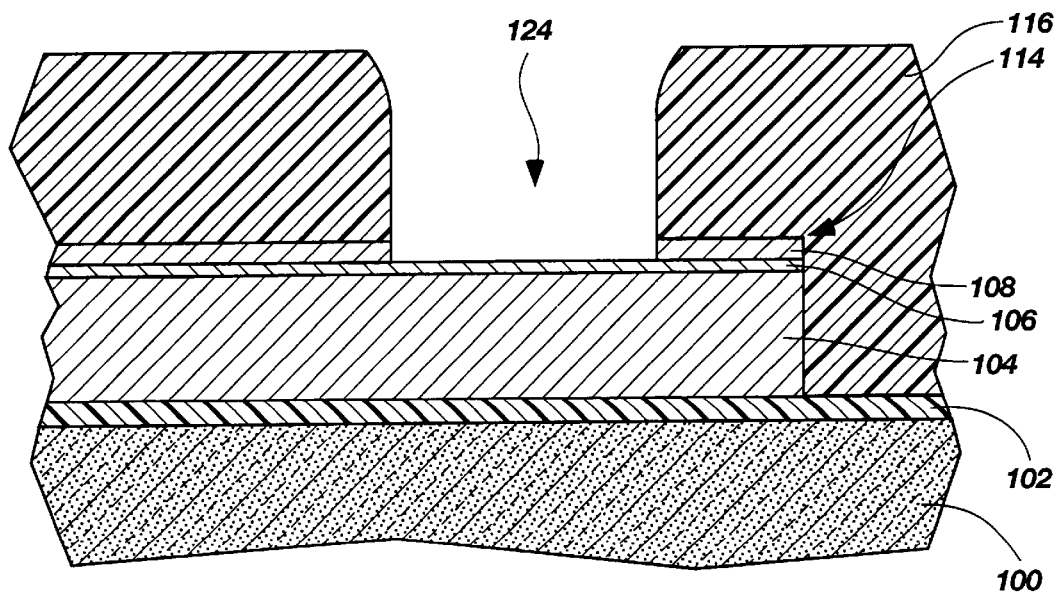

The oxide polymer residue layer 126 and any remaining second resist material 118 are preferably removed using a hydrofluoric acid dip, ammonia/peroxide mixture (APM), tetramethyl ammonium hydroxide (TMAH), or the like, as shown in FIG. 7. If electrical resistance in the via 124 is a concern, a highly selectively etch consisting of trifluoronitride ($NF_3$) in a helium/oxygen carrier gas can be used to remove the silicide layer 108 in the via 124, as shown in FIG. 8.

Figure 9:
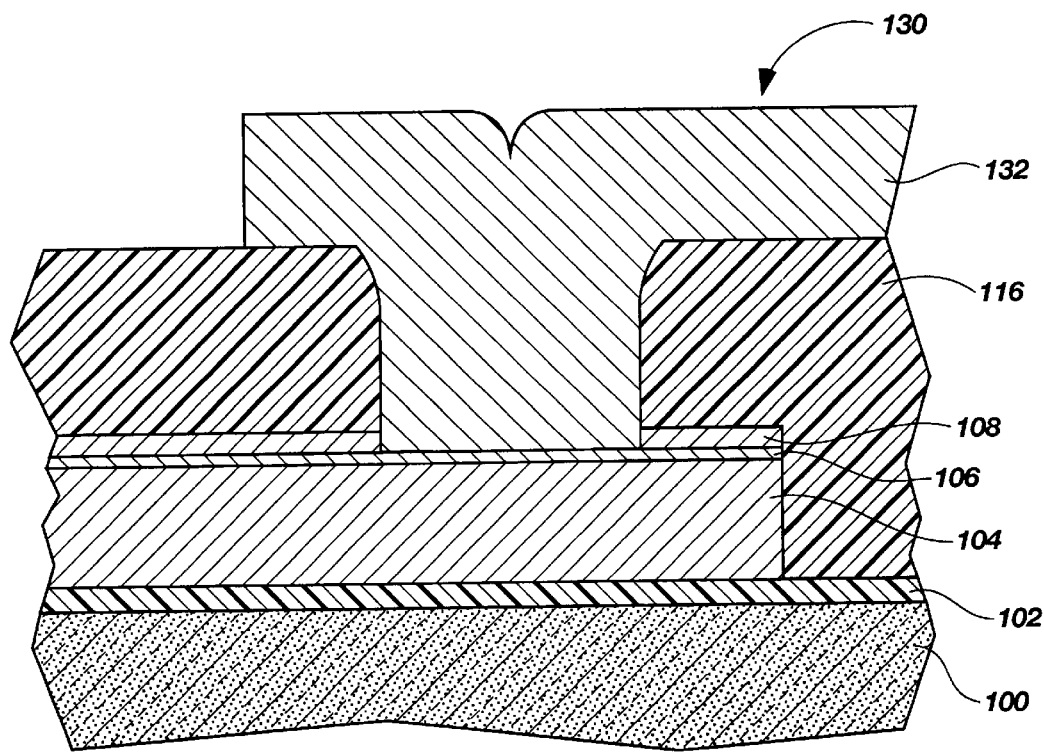
Figure 10:
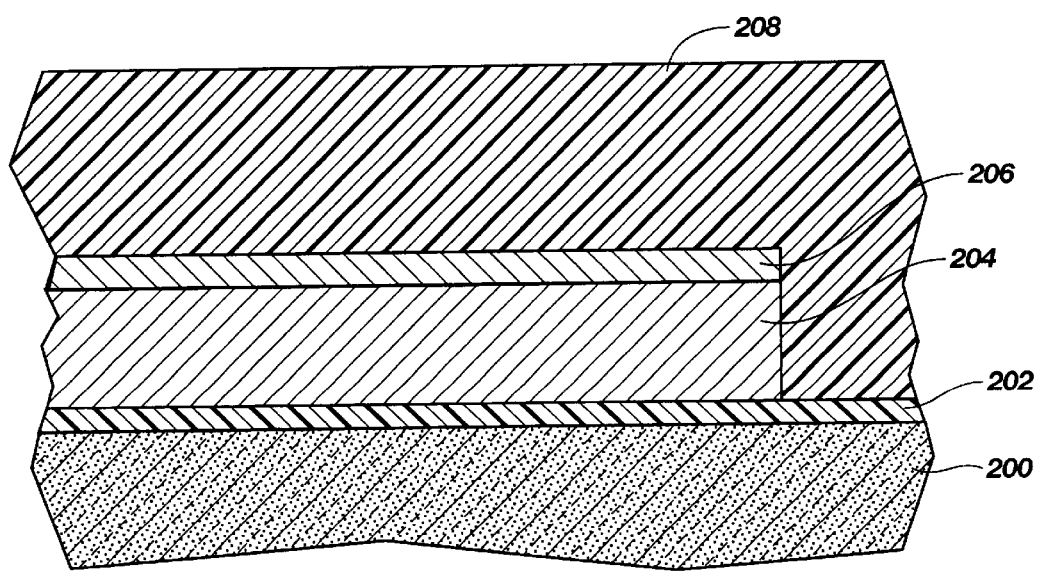
FIGS. 10–13 are side cross-sectional views of a via formation process according to a known technique.
Figure 11:
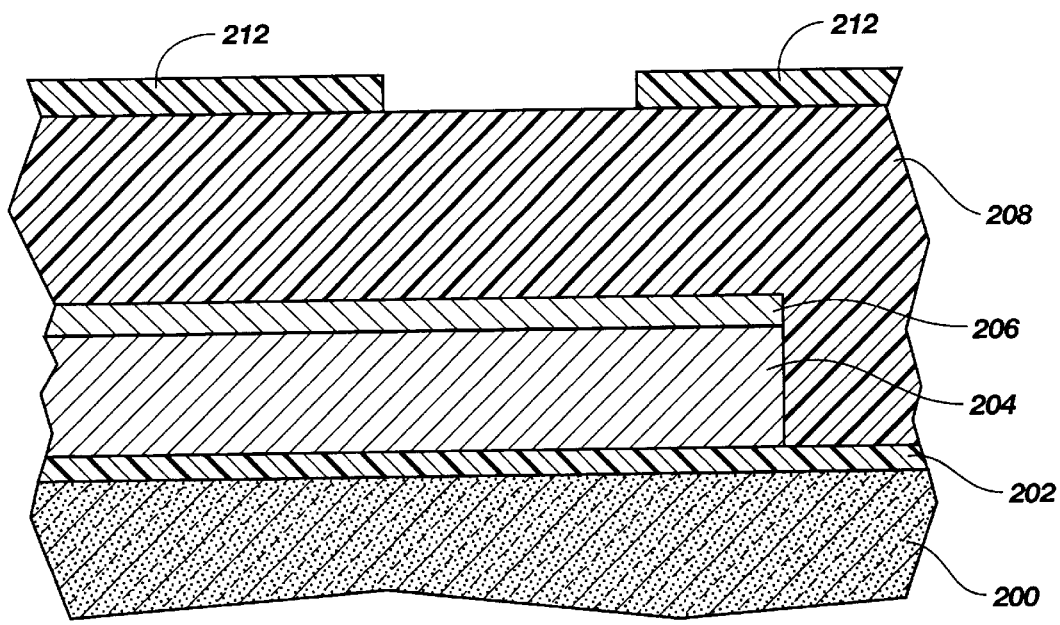
Figure 12:
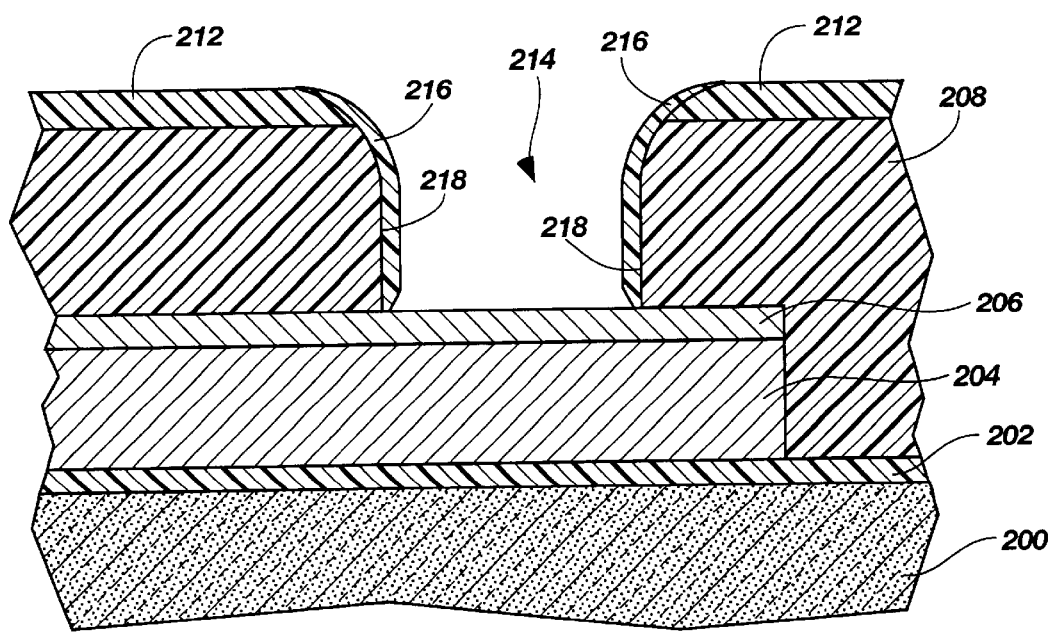
Figure 13:
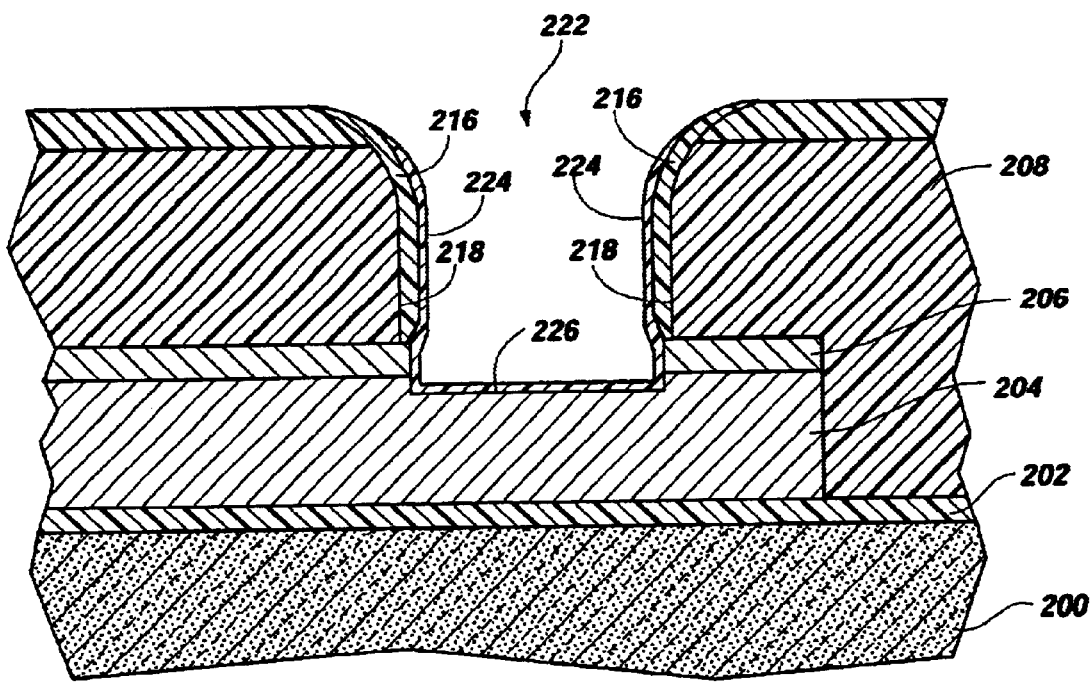

Once a clean via 124 is achieved, an electrical trace 130 may be formed by depositing a conductive material 132 into the via 124 and over the interlayer dielectric layer 116 in a predetermined pattern, as shown in FIG. 9. The conductive material 132 is preferably a metal, including but not limited to titanium, copper, silver, gold, aluminum, and alloys thereof. However, conductive polymers may be used. The deposition of the conductive material 132 may be effected by methods including, but not limited to, hot sputter/reflow, ionized plasma, hot pressure fill, as well as physical vapor deposition and chemical vapor deposition combinations.

EXAMPLE

An experiment was conducted with an aluminum/copper alloy layer (approximately 4 KÅ thick) deposited over a silicon dioxide material layer atop a semiconductor substrate. A titanium nitride barrier layer (approximately 100 Å thick) was disposed over the aluminum/copper alloy layer and a tungsten silicide layer (approximately 600 Å thick) was disposed over the tungsten silicide layer to form a layered structure. A silicon dioxide interlayer dielectric (approximately 5.5 KÅ thick) was deposited over the layered structure. A via was then etched through the silicon dioxide interlayer dielectric with an oxide etch (60% overetch), preferably with an etch gas comprising 15 sccm of $CHF_3$ and 60 sccm of $CF_4$. The oxide polymer residue formed during the oxide etch was removed with a stripper followed by a 20:1 ($H_3PO_4$:$H_2O_2$) wash. Scanning electron micrographs taken of a cross-section of the via formed showed that no oxide polymer residue was present.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A layered conductive trace having a dielectric layer thereover, the dielectric layer having a via therethrough at a location over the layered conductive trace, the layered conductive trace comprising:
    a patterned conductive material comprising a metal alloy;
    a barrier layer disposed directly on top of the patterned conductive material; and
    a silicide material layer disposed directly on top of the barrier layer throughout a substantial extent thereof, wherein the via through the dielectric layer extends through the silicide material layer.

2. The layered conductive trace of claim 1, further including a semiconductor substrate carrying a dielectric material upon which the patterned conductive material is disposed.

3. The layered conductive trace of claim 1, wherein the patterned conductive material comprising a metal alloy consists of an alloy of aluminum and copper.

4. The layered conductive trace of claim 1, wherein the silicide material layer comprises tungsten silicide.

5. A layered conductive trace having a dielectric layer thereover, the dielectric layer having a via therethrough at a location over the layered conductive trace, the layered conductive trace comprising:
    a patterned aluminum/copper alloy conductive layer;
    a barrier layer disposed directly on top of and substantially coextensive with the patterned aluminum/copper alloy conductive layer; and
    a silicide material layer disposed directly on top of and substantially coextensive with the barrier layer, wherein the via through the dielectric layer extends through the silicide material layer.

6. The layered conductive trace of claim 5, wherein the barrier layer comprises titanium.

7. The layered conductive trace of claim 5, wherein the barrier layer comprises titanium nitride.

8. A semiconductor device including at least one layered conductive trace having a dielectric layer thereover, the dielectric layer having a via therethrough at a location over the layered conductive trace, the layered conductive trace comprising:
    a patterned conductive metal layer;
    a barrier layer disposed directly on top of and substantially coextensive with the patterned conductive metal layer; and
    a silicide material layer disposed over the barrier layer, wherein the barrier layer and the silicide material layer are configured in a substantially similar pattern, the silicide material layer overlying the barrier layer, and wherein the via through the dielectric layer extends through the silicide material layer.

9. The semiconductor device of claim 8, further including a semiconductor substrate carrying a dielectric material upon which the patterned conductive metal layer is disposed.

10. The semiconductor device of claim 8, wherein the patterned conductive metal layer comprises an aluminum/copper alloy.

11. The semiconductor device of claim 8, wherein the silicide material layer comprises tungsten silicide.

12. The semiconductor device of claim 8, wherein the barrier layer comprises titanium.

13. The semiconductor device of claim 8, wherein the barrier layer comprises titanium nitride.

14. A layered conductive trace having a dielectric layer thereover, the dielectric layer having a via therethrough at a location over the layered conductive trace, the layered conductive trace comprising:
    a patterned conductive metal layer;
    a barrier layer disposed directly on top of and substantially coextensive with the patterned conductive metal layer; and
    a silicide material layer disposed over the barrier layer, the silicide material layer separating the barrier layer from an interlayer dielectric layer disposed over the layered conductive trace, wherein the via through the dielectric layer extends through the silicide material layer.

15. The layered conductive trace of claim 14, further comprising a semiconductor substrate carrying a dielectric material upon which the patterned conductive metal layer is disposed.

16. The layered conductive trace of claim 14, wherein the patterned conductive metal layer comprises an aluminum/copper alloy.

17. The layered conductive trace of claim 14, wherein the silicide material layer comprises tungsten silicide.

18. The layered conductive trace of claim 14, wherein the barrier layer comprises titanium nitride.

19. The layered conductive trace of claim 14, wherein the barrier layer comprises titanium.

* * * * *